United States Patent [19]
Paul

[11] 4,419,762
[45] Dec. 6, 1983

[54] ASYNCHRONOUS STATUS REGISTER

[75] Inventor: Dieter G. Paul, Fullerton, Calif.

[73] Assignee: Sperry Corporation, New York, N.Y.

[21] Appl. No.: 346,404

[22] Filed: Feb. 8, 1982

[51] Int. Cl.³ .............................................. G11C 19/00
[52] U.S. Cl. ....................................... 377/66; 377/72;
377/73; 377/77
[58] Field of Search ....................... 377/66, 72, 73, 77,
377/81, 111, 115, 116

[56] References Cited

U.S. PATENT DOCUMENTS 3,200,339  8/1965  Gorlin .................................. 377/116
3,300,724  1/1967  Cutia ..................................... 377/77
3,329,834  7/1967  Klinikowski ......................... 377/77
3,345,574  10/1967  Hilberg ............................... 377/111
4,041,403  8/1977  Chiapporuli ......................... 377/111

Primary Examiner—John S. Heyman
Attorney, Agent, or Firm—G. Donald Weber, Jr.; Eugene T. Battjer

[57] ABSTRACT

A register circuit which is used to asynchronously monitor any data or logical function (or functions) and be able to retain the status of the monitoring until the register is interrogated whereupon the register is automatically reset and able to receive or monitor another status signal.

18 Claims, 3 Drawing Figures

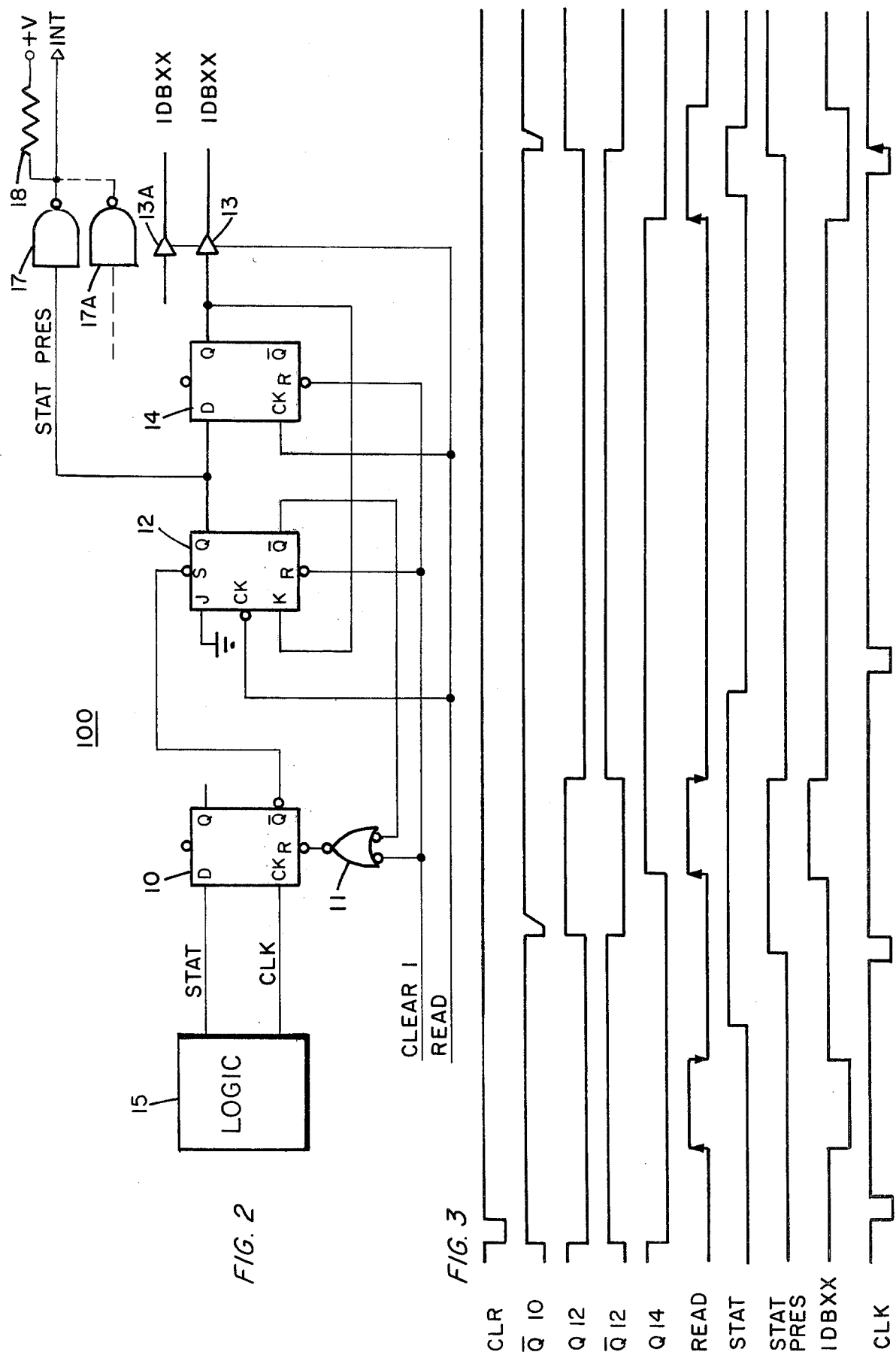

ASYNCHRONOUS STATUS REGISTER

BACKGROUND

1. Field of the Invention

This invention is directed to asynchronous register circuits, in general, and to circuits which are used to asynchronously monitor the status of other logical circuits, in particular.

2. Prior Art

There are many types of data processing circuitry available in the current market. These circuits do and perform many functions. As the circuits increase in speed, complexity and capability, the systems are frequently called upon to perform many functions asynchronously. This asynchronous operation is intended to increase the speed of performance of the computing system.

However, with the use of asynchronous operation, other types of controls are frequently required to supplant the clock system which is used in synchronous machines. In the synchronous machines known to date, one approach is to synchronously (or in series) sample or monitor the operation of multiple subsystems or peripheral units associated with the computer system. Thus, all of the types of input are sampled to determine whether or not an operation should be performed. Consequently, the systems operate extraordinarily slowly.

On the other hand, attempts have been made to provide asynchronous operation. These asynchronous machines tend to operate on the basis that information is detected when it occurs and causes an interrupt in the computer operation as a function of the priority of the various inputs. However, this type of system is still subject to the difficulties of prioritizing the inputs which are being monitored. Moreover, the application of input signals from more than one of the monitored systems sometimes causes difficulties in prioritizing or proper handling thereof. For example, it is essential that a subsequent input signal from the control circuitry should not improperly impact the operation of the system while a prior input is being operated upon. Moreover, it is highly desirable to have the system operate in such a fashion that that the monitoring operation is effective only when the data processing system is ready to receive the input indicating signal.

SUMMARY OF THE INVENTION

This invention is directed to a circuit which is capable of monitoring the status of input systems or devices. The input can be supplied in a clocked or synchronous manner. This circuit is, however, capable of operating on a basically asynchronous manner, i.e., upon request by the computing system. The circuit of this invention will be automatically reset to an initial condition when the status at the input thereof is read and detected by the rest of the system. In addition, the circuit provides an interrupt signal which indicates that a status signal is present so that the computing system can function accordingly and produce a status reading signal, if desired.

The circuit of the invention can be iterated and connected together in an OR-tied manner so that a plurality of input systems or devices can be monitored and a pluraity of output signals can be supplied to a single data bus for the computing system.

BRIEF DESCRIPTION OF THE DRAWINGS

FIG. 2 is a schematic block diagram of the circuit of the instant invention.

FIG. 3 is a timing diagram of the operation of the circuit shown in FIG. 2.

DESCRIPTION OF A PREFERRED EMBODIMENT

Figure 1:
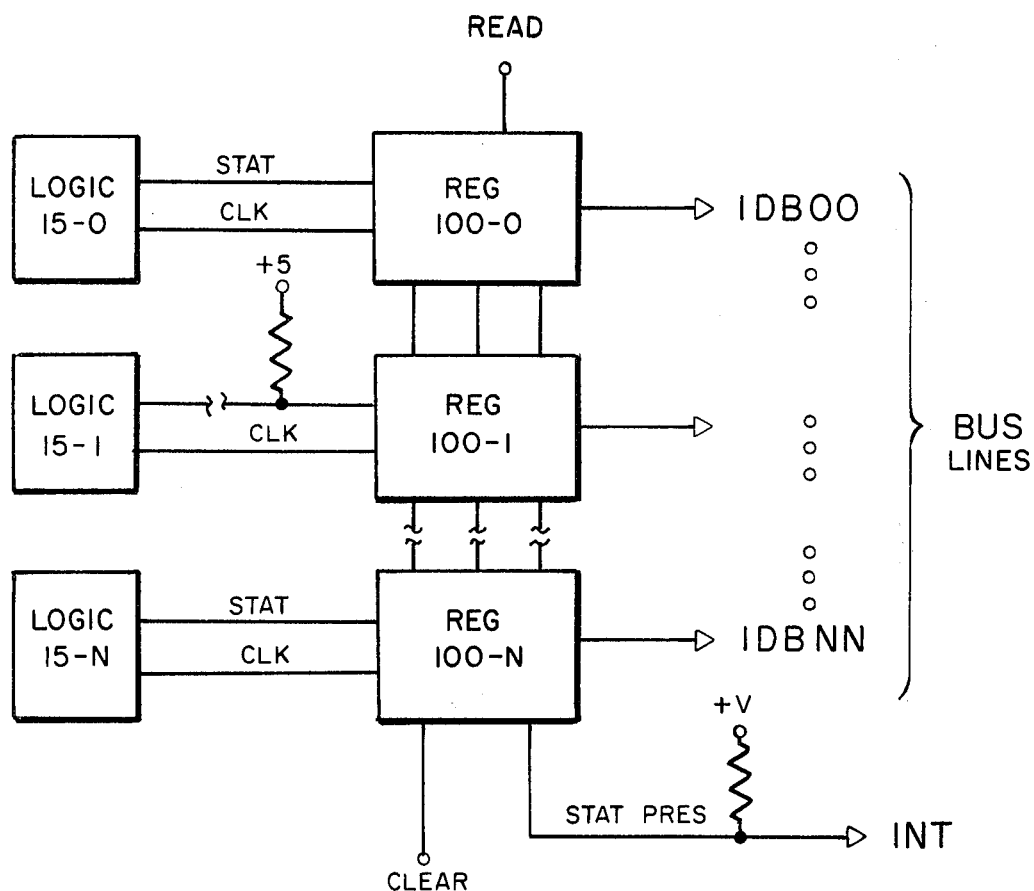
FIG. 1 is a block diagram of an illustrative type of circuit using the instant invention.

Referring now to FIG. 1 there is shown a schematic block diagram of a portion of a conventional type computing system. The portion which is depicted in FIG. 1 is directed to the invention described herein.

More particularly, FIG. 1 shows a plurality of logic blocks designated as 15-0, 15-1 through 15-N where N is any number. In addition, there are shown a plurality of registers designated as 100-0, 100-1 and 100-N. The respective logic circuits and registers (as denoted by the suffix character) are connected together such that the logic circuit provides a clock (CLK) and a status (STAT) signal to the associated register. In some cases, the STAT and CLK signals are provided directly and both the STAT and CLK signals are required. In other cases, as for example in the $-1$ channel, the STAT line is tied to a voltage level, for example $+5$ volts. In this case, the STAT line is, effectively, always activated and the STAT signal is transferred to the associated register as a function of the application of the CLK signal. The particular method of defining the signals which are supplied from the logic circuit to the register is not a part of the invention, per se, and any arrangement can be used. So long as the appropriate logic structure (positive logic, negative logic or the like) is observed.

The outputs of the respective registers are connected to terminals IDB00 through IDBNN, respectively. These terminals are connected to a common bus line. The signals supplied on these terminals will be identified with the same reference terminology.

A common CLEAR signal is applied to each of the registers as is a common READ signal. These signals selectively clear all the registers for initial operation or permit the registers to operate and produce the appropriate output signals at the output terminals thereof. In addition, each of the registers has one output terminal thereof tied together in an OR gate arrangement to produce the status present (STAT PRES) signal. In particular, this output terminal is connected to a pull-up resistor which normally applies a prescribed voltage level at the output terminal (INT). With the application of a STAT PRES signal, a negative signal is supplied at the INT output terminal which produces an interrupt signal.

In operation, the logic circuits 15-0, and so forth, are considered to be specific logic circuits, peripheral devices or the like which are used with the computer. These devices will, from time-to-time, require attention from a microprocessor or other type of computing device which is a portion of the system (but is not shown in FIG. 1). The microprocessor or the like is connected to the bus line to receive the IDBXX signals as well as the interrupt signal INT.

When one of the logic circuits is properly activated, a STAT signal is supplied thereby to the associated register. The register then produces a STAT PRES signal which is used to generate an interrupt signal. The interrupt signal is supplied to the microprocessor to indicate that the STAT signal is present at one or more of the registers. At the appropriate time, the microprocessor then samples the bus line and observes the condition of the output signals from the respective registers. In the preferred embodiment, the register which has been activated by its associated logic circuit will produce a binary 1 while all other registers will produce a binary 0. The microprocessor will then receive the signal from the registers and perform the appropriate operation.

It is important to note that one or more logic circuits can produce status signals at the same time or in overlapping arrangement. Consequently, without proper regulation, the microprocessor would be fed improper or ambiguous information and inappropriate operation of the microprocessor could occur. Consequently, it is an important feature that the registers are enabled by the STAT signal which is supplied thereto to produce a STAT PRES signal. However, the registers are only enabled to produce an output signal on the bus line in response to the application of a READ signal. Moreover, once the READ signal has been applied to a register, further status signals cannot be processed therethrough until a full cycle operation of the register is complete as will be described in detail hereinafter. Suffice it to say at this point, once the READ phase of the operation has begun, the particular input signal at the register is propogated therethrough and any changes at this input terminal are blocked from passing through the register until the READ phase is repeated and recycled.

Referring now to FIG. 2, there is shown a more detailed schematic version of one embodiment of the circuit arrangement shown in FIG. 1. In particular, logic circuit 15 may be of any appropriate configuration such as a bus circuit or the like. This circuit is defined as being a source of a status signal (STAT) and a clock signal (CLK) which are produced elsewhere. The STAT signal can be considered as a flag signal in any associated computer circuitry. Also, as noted, STAT and CLK can be used to indicate that a particular function has been appropriately performed. In many cases, other processes or functions are forced to occur, permitted to occur or the like dependent upon the condition of the status (STAT) and clock (CLK) signals. Consequently, it is highly desirable to be able to determine whether or not a status signal has been produced at any particular time.

Logic circuit 15 is connected to supply the STAT and and CLK signals to the D and CK input terminals, respectively, of flip-flop 10 which is part of register 100. The Q output terminal is not connected while the $\bar{Q}$ terminal is connected to the set (S) terminal of J-K flip-flop 12. The J input of flip-flop 12 is connected to ground. The K input of flip-flop 12 is connected to the Q output terminal of D flip-flop 14. The Q output terminal of flip-flop 12 is connected to the D input terminal of flip-flop 14 and to the status present logic circuitry. This circuitry includes an open collector driver 17 which, when activated, pulls the output terminal to ground. This driver circuit can be OR'd with circuits similar to the circuit described herein. The output of the driver circuits provides an interrupt signal INT which is supplied to other external circuitry (e.g., a microprocessor) to effect control thereover. The $\bar{Q}$ output terminal of flip-flop 12 is connected to one input terminal of AND gate 11. The other input terminal of AND gate 11 is connected to the reset terminals of flip-flops 12 and 14 and to the clear signal terminal (CLEAR).

The output terminal of AND gate 11 is connected to the reset (R) terminal of flip-flop 10. In addition, the clock terminals CK of flip-flops 12 and 14 are connected to the READ signal input line which is also connected to the trigger terminal of tri-state circuits 13 and 13A. The input terminal of tri-state circuit 13 is connected to the Q output terminal of flip-flop 14. The output terminal of tri-state circuit 13 is connected to produce the output signal IDBXX which is connected to an appropriate output circuit such as a bus or the like.

In describing the circuit operation, reference is made to FIGS. 2 and 3, concurrently. The circuit is first cleared by the application of the clear signal CLR to one input of AND gate 11 and to the reset terminals of flip-flops 12 and 14. The clear signal is defined to be a low level signal. This low level signal causes AND gate 11 to supply a low level signal to flip-flop 10. The low level clear signal is also supplied to the reset terminals of flip-flops 12 and 14. As a result, each of flip-flops 10, 12 and 14 produces a high level output signal at the respective $\bar{Q}$ output terminal. Likewise, each of the flip-flops produces a low level signal at the respective Q output terminal and the system is initialized.

Initially, it is assumed that a status signal (STAT) is not provided by logic circuit 15. Thus, the STAT signal which is supplied to the D input terminal of flip-flop 10 is a low level or binary zero signal. With the application of the clock (CLK) signal to flip-flop 10, no change is effected. Consequently, no changes occur throughout the circuit.

With the application of a READ signal, tri-state circuit 13 is activated. Thus, the low level Q14 signal is supplied to the data bus line as signal IDBXX. However, no other changes occur in any of the signals previously discussed.

Next, it is assumed that the STAT signal generated by logic circuitry 15 changes to the high level which is indicative of the presence of a status signal. Thus, a high level signal is supplied to the D input terminal of flip-flop 10. Thus, the D input signal is transferred through flip-flop 10 whereby the $\bar{Q}$ output signal from flip-flop 10 switches momentarily from the high level to the low level and then back. The switching of signal $\bar{Q}$10 causes flip-flop 12 to be set so that the output signals from flip-flop are changed at this time. Thus, the signal Q12 switches to the high level and signal $\bar{Q}$12 switches to the low level. As a result, the STAT PRES signal is a high level and produces an interrupt signal at the INT output terminal. Also, the low level $\bar{Q}$12 signal is returned to the reset terminal R of flip-flop 10 whereby the signal $\bar{Q}$10 is reset to the high level. (Thus, the momentary pulse-type switching of flip-flop 10.) Nevertheless, the output signals from flip-flop 12 remain as noted.

With the application of the next READ signal, the leading or positive going edge is effective to cause flip-flop 14 to be activated. As a result output signal Q14 switches to the high level. With the concurrent application of the READ signal and the high level signal at the output terminal Q of flip-flop 14, the tri-state circuit 13 is activated and the high level output signal IDBXX is produced. This signal condition is supplied to the data bus and indicates the associated device is to be acted upon by the microprocessor, for example.

With the trailing, or negative going edge of the READ signal, flip-flop 12 is triggered wherein the output signal Q12 and $\bar{Q}$12 switch levels. In addition, the tri-state circuit 13 is inactivated wherein the output signal IDBXX reverts to the mid-level.

When the STAT signal reverts to the low level, indicative of the absence of the status signal, the D input terminal flip-flop 10 receives a low level STAT signal. Upon the application of the clock signal, signal $\overline{Q}10$ at the $\overline{Q}$ output terminal of flip-flop 10, remains at the high level and $\overline{Q}10$ is supplied to the set terminal of flip-flop 12. This high level SET signal has no effect on flip-flop 12 which continues to produce a low level signal at terminal Q and a high level signal at terminal $\overline{Q}$. The low level Q12 signal is translated into a low level STAT PRES signal which indicates the absence of a STAT signal. The IDBXX signal remains inactive in the absence of a READ signal. Application of a READ signal will produce a low signal as described, supra.

The circuit operation continues in the same fashion. That is, with the absence of STAT and CLK signals from logic circuit 15, the signals remain in the condition as shown. With the application of a further STAT and CLK signal from logic circuit 15, the operation of the circuit will, generally, be effected by the READ signals as described earlier.

It can also be shown that the circuit operates to lock out certain signals. For example, as shown in FIG. 2, the situation can arise wherein a STAT signal occurs while the READ signal is active. In this case, the READ signal activates the tri-state circuit 13 and transfers the low level Q12 signal to the output Q14 of flip-flop 14. Thus, the IDBXX signal is at the low level. However, the STAT PRES signal is low (as determined by signal Q12).

The application of the STAT and CLK signals does not trickle through the circuit, however. With the application of the CLK signal (concurrent with the STAT signal), the positive going edge of the CLK signal triggers flip-flop 10. The high level STAT signal is transferred through, to set flip-flop 12 as described, supra. Thus, signals Q12 and $\overline{Q}12$ are high and low level signals, respectively. Also, the $\overline{Q}10$ signal from flip-flop 10 is pulsed as before. However, the STAT PRES signal remains high to produce an interrupt signal (INT). Thus, a READ signal will be generated to read the STAT PRES signal in the proper sequence.

Thus, there is shown and described a unique status register which is fully asynchronous in operation. That is, the CLEAR signal is applied only at the beginning of operation to present initial conditions and parameters. The CLK signal is provided as a clock and is used only in the role of changing the the status of flip-flop 10 as a function of the status of the STAT input signal. The actual circuit operation is controlled by the READ signals which function as READ control for the circuit. The circuit described herein is illustrative of the invention and is not intended to be limitative. Rather, the scope of the invention is limited only by the scope of the claims appended hereto.

Having thus described a preferred embodiment of the invention, what is claimed is:

1. An asynchronous status register comprising,
   first bistable means connected to receive input signals,
   second bistable means connected to receive signals from said first bistable means,
   third bistable means connected to receive signals from said second bistable means,
   means connecting said second bistable means to said first bistable means to selectively reset said first bistable means,
   means connecting said third bistable means to said second bistable means to selectively change the state of said second bistable means, and
   control means for supplying signals to said second and third bistable means to selectively permit operation thereof.

2. The asynchronous status register recited in claim 1 wherein,
   said first, second and third bistable means comprises first, second and third flip-flop means, respectively.

3. The asynchronous status register recited in claim 2 wherein,
   said first and third flip-flop means comprise D-type flip-flops.

4. The asynchronous status register recited in claim 2, wherein,
   said second flip-flop means comprises a J-K flip-flop.

5. The asynchronous status register recited in claim 1 including,
   gate means connected between said second bistable means and said first bistable means.

6. The asynchronous status register recited in claim 1 including,
   output means connected to receive output signals from said third bistable means.

7. The asynchronous status register recited in claim 1 including,
   signal means connected to receive output signals from said second bistable means.

8. The asynchronous status register recited in in claim 7, wherein,
   said signal means includes driver means for producing a signal representative of the condition of said second bistable means.

9. The asynchronous status register recited in claim 6 wherein,
   said output means includes output gate means for selectively producing an output signal representative of the state of said third bistable means.

10. The asynchronous status register recited in claim 9, wherein,
    said output gate means includes a tri-state gating device.

11. The asynchronous status register recited in claim 1 including,
    input means connected to selectively supply an input signal to said first bistable means.

12. The asynchronous status register recited in claim 11 wherein,
    said input means comprises a logic circuit and said input signal is representative of the status of said logic circuit.

13. The asynchronous status register recited in claim 6 wherein,
    said output means includes bus line means connected to selectively receive signals from said third bistable means.

14. The register recited in claim 5 wherein, said gate means comprises an AND gate.

15. The register recited in claim 14 wherein,
    said AND gate is connected to receive signals from said second bistable means.

16. The register recited in claim 1 wherein,
    said control means provides a clear signal for selectively resetting each of said first, second and third bistable means.

17. The register recited in claim 12 wherein,
    said input means supplies a clock signal to said first bistable means to selectively operate said first bistable means as a function of said input signal.

18. The register recited in claim 4 wherein,
    the K input terminal of said second flip-flop means is connected to the output terminal of said third flip-flop means.

* * * * *